(12) United States Patent
Sandhu (10) Patent No.: US 10,347,637 B2
(45) Date of Patent: *Jul. 9, 2019

(54) SEMICONDUCTOR DEVICES AND SYSTEMS INCLUDING MEMORY CELLS AND RELATED METHODS OF FABRICATION

(71) Applicant: Micron Technology, Inc., Boise, ID (US)

(72) Inventor: Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 14/927,721

(22) Filed: Oct. 30, 2015

(65) Prior Publication Data

US 2016/0049406 A1 Feb. 18, 2016

Related U.S. Application Data

(62) Division of application No. 13/234,996, filed on Sep. 16, 2011, now Pat. No. 9,177,872.

(51) Int. Cl.
*H01L 27/108* (2006.01)
*H01L 21/8254* (2006.01)
*H01L 49/02* (2006.01)

(52) U.S. Cl.
CPC .... *H01L 27/10805* (2013.01); *H01L 21/8254* (2013.01); *H01L 27/1085* (2013.01);
(Continued)

(58) Field of Classification Search
CPC ...................... H01L 27/1085; H01L 27/10876
See application file for complete search history.

(56) References Cited

U.S. PATENT DOCUMENTS 6,603,168 B1 8/2003 Choi
6,888,769 B2 5/2005 Kirsch
(Continued)

FOREIGN PATENT DOCUMENTS

WO 2008139654 A1 11/2008

OTHER PUBLICATIONS

Li et al., "Novel Schottky Barrier MOSFET with Dual-layer Silicide Source/Drain Structure," Solid-State and Integrated Circuits Technology, 2004. Proceedings. 7th International Conference on, vol. 1, pp. 69-72.

(Continued)

*Primary Examiner* — Peniel M Gumedzoe
*Assistant Examiner* — Christopher A Johnson
(74) *Attorney, Agent, or Firm* — TraskBritt (57) ABSTRACT

A memory cell is disclosed. The memory cell includes a transistor and a capacitor. The transistor includes a source region, a drain region, and a channel region including an indium gallium zinc oxide (IGZO, which is also known in the art as GIZO) material. The capacitor is in operative communication with the transistor, and the capacitor includes a top capacitor electrode and a bottom capacitor electrode. Also disclosed is a semiconductor device including a dynamic random access memory (DRAM) array of DRAM cells. Also disclosed is a system including a memory array of DRAM cells and methods for forming the disclosed memory cells and arrays of cells.

19 Claims, 9 Drawing Sheets

(52) U.S. Cl.
CPC .. *H01L 27/10873* (2013.01); *H01L 27/10876* (2013.01); *H01L 28/60* (2013.01)

(56) References Cited

U.S. PATENT DOCUMENTS

| | | | |
|---|---|---|---|
| 9,177,872 B2 * | 11/2015 | Sandhu | H01L 21/8254 |
| 2002/0028568 A1 | 3/2002 | Ueno et al. | |
| 2003/0234414 A1 * | 12/2003 | Brown | H01L 27/10808 257/300 |
| 2008/0173920 A1 | 7/2008 | Juengiing | |
| 2010/0025678 A1 | 2/2010 | Yamazaki et al. | |
| 2010/0051949 A1 | 3/2010 | Yamazaki et al. | |
| 2010/0140614 A1 | 6/2010 | Uchiyama et al. | |
| 2010/0304528 A1 | 12/2010 | Kim et al. | |
| 2011/0084758 A1 * | 4/2011 | Shibata | G11C 5/063 327/565 |
| 2011/0097842 A1 | 4/2011 | Yang et al. | |
| 2011/0156025 A1 | 6/2011 | Shionoiri et al. | |
| 2011/0223731 A1 | 9/2011 | Chung et al. | |
| 2011/0260118 A1 | 10/2011 | Yano et al. | |
| 2011/0284838 A1 * | 11/2011 | Saito | G11C 5/005 257/43 |
| 2012/0032172 A1 * | 2/2012 | Noda | H01L 29/41733 257/57 |
| 2012/0161228 A1 * | 6/2012 | Weng | H01L 51/0554 257/331 |
| 2013/0069052 A1 | 3/2013 | Sandhu | |

OTHER PUBLICATIONS

Fung et al., "Two-Dimensional Numerical Simulation of Radio Frequency Sputter Amorphous In—Ga—Zn—O Thin-Film Transistors," J. Applied Physics, vol. 106, (Oct. 28, 2009), pp. 084511-1-084511-10.

Hofmann et al., Surrounding Gate Select Transistor for 4F2 Stacked Gbit DRAM, Solid-State Device Research Conference, 2001. Proceeding of the 31st European , Sep. 11-13, 2001, pp. 131-134.

Kumomi et al., Materials, Devices, and Circuits of Transparent Amorphous-Oxide Semiconductor, Journal of Display Technology, vol. 5, No. 12, Dec. 2009, pp. 531-540.

Liang et al., Cross-Point Memory Array Without Cell Selectors—Device Characteristics and Data Storage Pattern Dependencies, IEEE Transactions on Electron Devices, vol. 57, No. 10, Oct. 2010. pp. 2531-2538.

Matsuzaki et al., 1Mb Non-Volatile Random Access Memory Using Oxide Semiconductor, Memory Workshop (IMW), 2011 3rd IEEE International, May 22-25, 2011, 4 pages.

Münzenrieder et al., "Room Temperature Fabricated Flexible NiO/IGZO pn Diode Under Mechanical Strain," Solid-State Electronics, vol. 87, (Sep. 2013), pp. 17-20 (Abstract only).

Song et al., Short Channel Characteristics of Gallium-Indium-Zinc-Oxide Thin Film Transistors for Three-Dimensional Stacking Memory, IEEE Electron Device Letters, vol. 29, No. 6, Jun. 2008, pp. 549-552.

* cited by examiner

*FIG. 6*

SEMICONDUCTOR DEVICES AND SYSTEMS INCLUDING MEMORY CELLS AND RELATED METHODS OF FABRICATION

CROSS-REFERENCE TO RELATED APPLICATION

This application is a divisional of U.S. patent application Ser. No. 13/234,996, filed Sep. 16, 2011, now U.S. Pat. No. 9,177,872, issued Nov. 3, 2015, the disclosure of which is hereby incorporated in its entirety herein by this reference.

TECHNICAL FIELD

The present disclosure, in various embodiments, relates generally to the field of memory device design and fabrication. More particularly, this disclosure relates to the design and fabrication of memory cells and devices, and to systems incorporating such cells.

BACKGROUND

Conventional volatile memory cells, such as dynamic random access memory (DRAM) cells, may include a capacitor and a transistor. The capacitor may be referred to in the art as a cell capacitor or a storage capacitor. The transistor may be referred to in the art as an access transistor. The transistor conventionally includes a channel region between a pair of source/drain regions and a gate configured to electrically connect the source/drain regions to one another through the channel region. The channel region is usually formed of a semiconductor material.

The transistor functions to apply or remove charge on the capacitor, thus affecting a logical state, e.g., a binary value of either 0 or 1, defined by the storage charge. The binary value of a cell is generally determined by "reading" the cell. Reading the cell involves sensing the voltage stored by the capacitor and comparing that voltage to a reference voltage. If the detected stored voltage meets or exceeds the reference voltage, the cell may be read at a logical state of 1; otherwise, the cell may be read at a logical state of 0. After reading, the access transistor may be further used to re-charge the capacitor to return the capacitor to a charge corresponding to the read logical value.

To charge, discharge, read, or recharge the capacitor, the transistor may be selectively turned to an "on" state, in which current flows between the source and drain regions through the channel region of the transistor. The transistor may be selectively turned to an "off" state, in which the flow of current is substantially halted. Ideally, in the off state, the capacitor would retain, without change, its charge. However, capacitors of conventional volatile memory cells experience discharges of current over time. Therefore, even in the "off" state, a conventional volatile memory cell will often still undergo some flow of current from the capacitor. This off-state leakage current is known in the industry as a sub-threshold leakage current.

To account for the sub-threshold leakage current and to maintain the capacitor of the memory cell at an appropriate charge to correspond to its intended logical value, conventional volatile memory cells are frequently refreshed. Refreshing may involve reading the logical value of the cell, which reading may decrease the charge of the capacitor, and then, if necessary, recharging the capacitor to return the cell to the read logical value. A conventional DRAM memory cell may, for example, be refreshed as frequently as every 64 microseconds. The appropriate refresh frequency, which is determined by the rate of current leakage through the channel, impacts at what voltage the capacitor must be charged to correspond to the appropriate logical value. For example, when the sub-threshold leakage current is relatively high, the capacitor must generally be charged to a relatively high voltage so that an accurate logical value will be detected at the appropriate time. Otherwise, supplying the capacitor with too low of a charge could lead to a mis-read in the cell's logical value after a period of time.

Refreshing DRAM memory cells consumes a certain amount of power. Where an array of memory cells of a memory device is incorporated within a portable device, for example a so-called "smart" phone such as an IPHONE® or a BLACKBERRY® device, the power consumed by the memory device to refresh the cells and account for sub-threshold leakage current affects the length of time during which the portable device may be used before batteries must be recharged or the device must be connected to an external power supply.

The sub-threshold leakage current can also impact the fabrication and configuration of an array of memory cells within a memory device. Fabricating a semiconductor memory device upon a substrate necessarily leads to occupation of a certain surface area of the substrate by the footprint of the cell within the device. Memory cells are often constructed in arrays, in which individual cells are arranged in columns and rows, upon the primary surface of the substrate. The primary surface is generally the uppermost, exterior surface of the substrate. Often, the available area on a given substrate's primary surface is limited, and maximizing the use of the substrate requires maximizing the density of devices fabricated on the substrate and therefore also the density of cells fabricated within each device. In a planar array of semiconductor cells occupying the same horizontal plane, such as the surface of the substrate, maximizing cell density includes not only minimizing the size of the cells but packing the cells as close to one another as possible without damaging the operability of the cells. If volatile memory cells are packed too closely to one another, unwanted current leakage paths may inhibit the operation of the cell. These unwanted current leakage paths may be through the channel region of the transistor or through other components of the cell, such as the dielectric material of the capacitor.

Efforts have been made to increase cell density by fabricating semiconductor cells, including memory cells, in three-dimensional arrays, also known as stacked arrays. However, when fabricating stacked arrays of cells, thermal budgets set by the components of already-fabricated components in the stack are a consideration when additional components are added. That is, fabrication of components of a memory cell often involves heating materials of already-fabricated components of the cell to temperatures well in excess of 200 degrees Celsius. After fabricating a first array of semiconductor components, when fabricating a second array of components stacked above the first array, it is desirable not to use fabrication processes that require processing temperatures high enough to potentially damage the already-formed components in the first array.

Accordingly, sub-threshold leakage current rates, refresh rates, cell size, and thermal budgets of memory cells are often important considerations in the design, fabrication, and use of volatile memory cells and arrays of cells incorporated in memory devices.

DETAILED DESCRIPTION

Memory cells, arrays including such memory cells, semiconductor devices including such arrays, systems including such arrays, and methods for fabricating and using such cells or arrays are disclosed. The memory cells include access transistors having channel regions formed with indium gallium zinc oxide (IGZO), also referred to in the art as gallium indium zinc oxide (GIZO). IGZO exhibits low sub-threshold leakage current. Volatile memory cells having channel regions formed of IGZO may accommodate high cell and device packing densities and refreshing of the cells relatively infrequently. The structures of embodiments of the present disclosure may be formed at relatively low temperatures, making the present structures conducive for fabrication in stacked array structures, including cross-point memory array structures. IGZO may be any composition of indium (In), gallium (Ga), zinc (Zn), and oxygen (O). For example, without limitation, IGZO may have an In:Ga:Zn:O ratio of 1:1:1:4, may have an $In_2O_3:Ga_2O_3:ZnO$ ratio of 2:2:1, or may be represented by the formula $InGaO_3(ZnO)_5$.

As used herein, the term "substrate" means and includes a base material or construction upon which components, such as those within memory cells, are formed. The substrate may be a semiconductor substrate, a base semiconductor layer on a supporting structure, a metal electrode, or a semiconductor substrate having one or more layers, structures, or regions formed thereon. While materials described and illustrated herein may be formed as layers, the materials are not limited thereto and may be formed in other three-dimensional configurations. The substrate may be a conventional silicon substrate or other bulk substrate including a layer of semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation or other semiconductor or optoelectronic materials, such as silicon-germanium ($Si_{1-x}Ge_x$, where x may be, for example, a mole fraction between 0.2 and 0.8), germanium (Ge), gallium arsenide (GaAs), gallium nitride (GaN), or indium phosphide (InP). Furthermore, when reference is made to a "substrate" in the following description, previous process stages may have been utilized to form regions or junctions in the base semiconductor structure or foundation.

As used herein, the terms "first," "second," "third," etc., may describe various elements, components, regions, materials, and/or sections, none of which are limited by these terms. These terms are used only to distinguish one element, component, region, material, or section from another element, component, region, material, or section. Thus, "a first element," "a first component," "a first region," "a first material," or "a first section" discussed below could be termed a second element, a second component, a second region, a second material, or second section without departing from the teachings herein.

As used herein, spatially relative terms, such as "beneath," "below," "lower," "bottom," "above," "upper," "top," "front," "rear," "left," "right," and the like, may be used for ease of description to describe one element or feature's relationship to another element(s) or feature(s) as illustrated in the figures. Unless otherwise specified, the spatially relative terms are intended to encompass different orientations of the device in use or operation in addition to the orientation depicted in the figures. For example, if a device in the figures is turned over, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The device may be otherwise oriented (rotated 90 degrees or at other orientations) and the spatially relative descriptors used herein interpreted accordingly.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular component, structure, device, or system, but are merely idealized representations that are employed to describe embodiments of the present disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but include deviations in shapes that result, for example, from manufacturing. For example, a region illustrated or described as box shape may, typically, have rough and/or nonlinear features. Moreover, sharp angles that are illustrated may be rounded. Thus, the regions illustrated in the figures are schematic in nature and their shapes are not intended to illustrate the precise shape of a region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, abrasive planarization, or other known methods.

Reference will now be made to the drawings, where like numerals refer to like components throughout. The drawings are not necessarily drawn to scale.

A memory cell is disclosed. The memory cell may be a volatile memory cell, e.g., a dynamic random access memory (DRAM) cell. The memory cell includes a transistor and a capacitor. The transistor has a source region, a drain region, and a channel region. The channel region may be formed of an indium gallium zinc oxide (IGZO) material. The capacitor is in operative communication with the transistor, and the capacitor includes a top capacitor electrode and a bottom capacitor electrode.

Figure 1A:
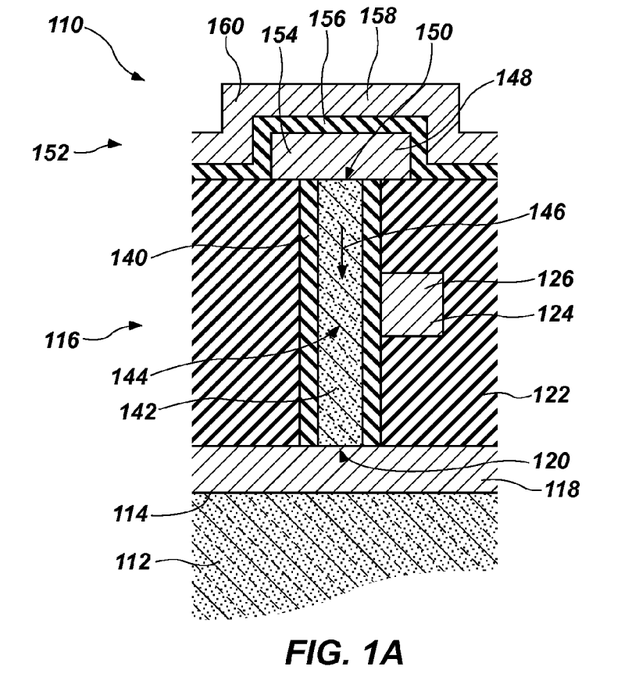
FIG. 1A is a cross-sectional, front elevation, schematic view of a DRAM cell of an embodiment of the present disclosure.
Figure 1B:
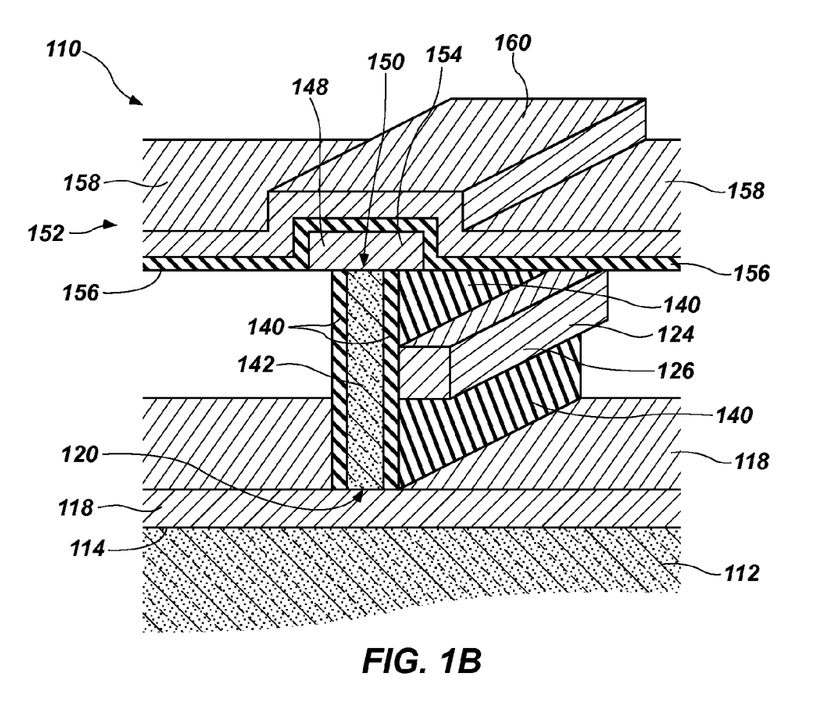
FIG. 1B is a cross-sectional, top and front perspective, schematic view of the DRAM cell in FIG. 1A.

FIG. 1A is a cross-sectional, front elevation view of a schematic of a memory cell 110, e.g., a DRAM cell, having a structure of an embodiment of the present disclosure. FIG. 1B is a cross-sectional, front and top perspective view of the schematic of FIG. 1A. The memory cell 110 includes a transistor 116 and a capacitor 152. The transistor 116 includes a source region 120, a drain region 150, and a channel region 144 disposed between the source region 120 and the drain region 150. During operation, the transistor 116 may be selectively turned to an "on" state to allow current to pass from the source region 120 to the drain region 150 through the channel region 144. The transistor 116 may also be selectively turned to an "off" state to substantially stop current from passing through the channel region 144. However, current may "leak" from the capacitor 152 through the channel region 144 in the "off" state in the direction of arrow 146 and/or in other directions. For example, a capacitor of a conventional DRAM cell containing a silicon channel region may exhibit an off-state current leakage of approximately $1 \times 10^{-15}$ A.

The channel region 144 may be formed from a channel material 142 including IGZO. IGZO may exhibit a high ratio of "on" state current to "off" state leakage current. For example, the IGZO channel material 142 may exhibit an off-state current leakage of approximately only $1 \times 10^{-24}$ A and an on-to-off current ratio of about 1,000,000,000 to 1. The low off-state leakage current may be conducive for use of the IGZO channel material 142 in a memory cell 110 that does not necessitate refreshing more than about once every hour, e.g., once every 10 hours or once every 24 hours.

The channel region 144 of the transistor 116 is in operative connection with both the source region 120 and the drain region 150 of the transistor 116. The source region 120 is formed by a first metal material 118 supported in or on a substrate 112 proximate to a primary surface 114 of the substrate 112. The first metal material 118 may be formed of a single metal, a mixture of metals, or multiple layers of different metals. Without limitation, the first metal material 118 may be formed substantially of copper with a tantalum and/or tantalum nitride barrier between the copper and the substrate 112. As another example, without limitation, the first metal material 118 may be formed of tungsten situated upon tungsten nitride. One of ordinary skill in the art will be capable of selecting other appropriate materials for use as the first metal material 118.

The first metal material 118 may be disposed across the majority or entirety of the primary surface 114 of the substrate 112. Alternatively, the first metal material 118 may be formed within the substrate 112, with an upper surface of the first metal material 118 occupying the same plane defined by the primary surface 114 of the substrate 112. One or more barrier materials may be provided between the first metal material 118 and the substrate 112. One or more barrier materials may alternatively or additionally be provided between the first metal material 118 and other components of the memory cell 110 formed on or near the first metal material 118.

The first metal material 118 may be in direct contact, at least partially, with the channel material 142. Contact between the first metal material 118 and the channel material 142 may form a Schottky source region 120.

The channel material 142 forming the channel region 144 of the transistor 116 may also be supported by the substrate 112. The channel material 142 may extend vertically from the substrate 112, and the transistor 116 of such vertically-directed channel region 144 may be a vertical access transistor. The channel region 144 may extend from the primary surface 114 of the substrate 112 substantially vertically.

The channel material 142 may be situated at least partially within a first insulative material 122 as shown in FIG. 1A. (For ease of illustration, the first insulative material 122 is not depicted in FIG. 1B.) The first insulative material 122 may surround and support the channel material 142. The first insulative material 122 may be a conventional interlayer dielectric material.

A second insulative material 140 may be provided along sidewalls of the channel material 142 and may isolate the channel material 142 from a gate electrode 126 formed of a second metal material 124. The second insulative material 140 may be formed of a conventional gate insulator material, such as an oxide, e.g., silicon dioxide. The second metal material 124 of the gate electrode 126 may be formed from one metal, from a mixture of metals, or from layers of different metals. For example, without limitation, the second metal material 124 of the gate electrode 126 may be formed of titanium nitride. A barrier material (not shown) may be provided between the gate electrode 126 and surrounding components. The second metal material 124 forming the gate electrode 126 may be isolated from the first metal material 118 by the first insulative material 122.

The gate electrode 126 is configured to operatively interconnect with the channel region 144 to selectively allow current to pass through the channel region 144 when the transistor 116 is turned "on." However, when the transistor 116 is turned "off," current may leak from the drain region 150 to the source region 120 as indicated by arrow 146. The gate electrode 126 may be configured as an access line (e.g., a word line) arranged perpendicular to the first metal material 118, which may be configured as a data/sense line (e.g., a bit line).

With continued reference to FIGS. 1A and 1B, the gate electrode 126 may include a single-side gate passing along one of the sidewalls of the channel material 142. In other embodiments, the gate electrode 126 may include a dual-sided gate with electrodes provided along at least a part of each of the sidewalls of the channel material 142. In still other embodiments, the gate electrode 126 may include a tri-sided gate with electrodes provided along at least a part of each of the sidewalls and front wall or rear wall of the channel material 142. Therefore, the gate electrode 126 may be configured as a "U" gate. In still other embodiments, the gate electrode 126 may include a surround gate conformally covering each of the sidewalls, front wall, and rear wall of the channel material 142. In still other embodiments, the gate electrode 126 may include a ring gate surrounding only a portion of each of the sidewalls, front wall, and rear wall of the channel material 142. Conventional techniques may be used for forming these other configurations of the gate electrode 126. Therefore, details for forming these other configurations are not provided herein.

The memory cell 110 further includes a third metal material 148 formed in operative connection with the channel region 144. In embodiments in which the channel region 144 is vertically disposed relative to the primary surface 114 of the substrate 112, the third metal material 148 may be formed atop the channel region 144. The third metal material 148 may be in direct contact with the channel material 142 forming the channel region 144. This direct contact between the metal and channel material may form a Schottky drain region 150.

Figure 4:
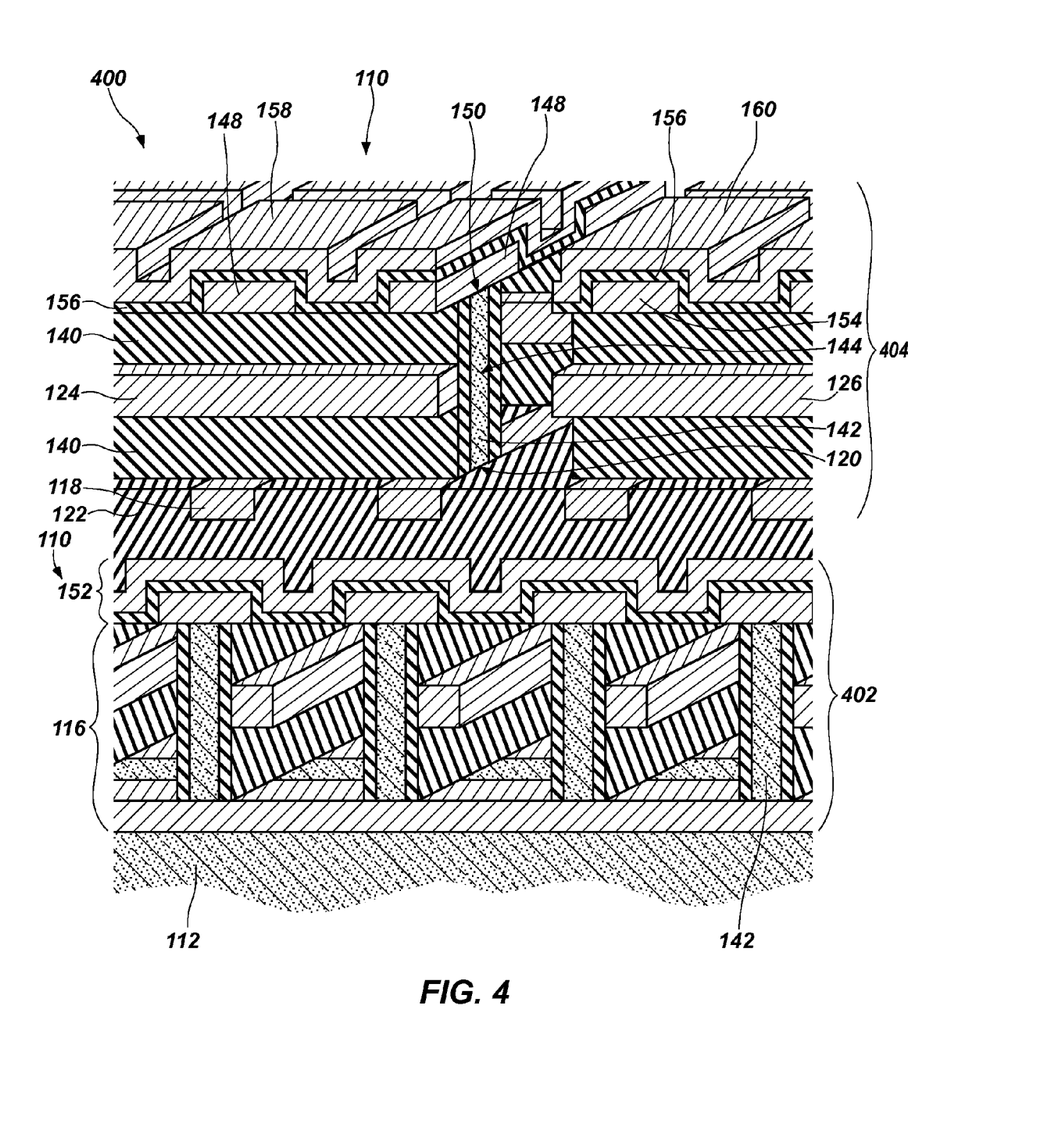
FIG. 4 is a cross-sectional, partial cut-away, top and front perspective, schematic view of an array of DRAM cells of an embodiment of the present disclosure.

The third metal material 148 may be formed of one metal, of a mixture of metals, or of layers of different metals. For example, without limitation, the third metal material 148 may be formed of titanium nitride. The third metal material 148 may be provided in lines parallel with the second metal material 124 of the gate electrode 126. The third metal material 148 may be formed in aligned segments (for example, as shown in FIG. 4), as, for example, when more than one memory cell 110 is to be formed of the third metal material 148. Each aligned segment of third metal material 148 may form a drain region 150 of a separate memory cell 110. Segmentation of the third metal material 148 may provide electrical isolation of each segment of third metal material 148 from one another.

The capacitor 152 of the memory cell 110 is in operative communication with the transistor 116. The capacitor 152 includes a top capacitor electrode 160 and a bottom capacitor electrode 154. A capacitor dielectric material 156 may be provided between the top capacitor electrode 160 and the bottom capacitor electrode 154.

The bottom capacitor electrode 154 of the capacitor 152 may be formed of the third metal material 148. Therefore, the drain region 150 of the access transistor 116 may be integrated with the bottom capacitor electrode 154 of the capacitor 152. That is, the metal of the third metal material 148 in contact with the semiconductor channel material 142 creates a Schottky drain and so provides the function of a drain region of a transistor while also providing the function of a bottom electrode of a capacitor. Forming the third metal material 148 to form the bottom capacitor electrode 154 therefore also creates the drain region 150 of the transistor 116 without a separate processing step or component. Accordingly, the bottom capacitor electrode 154 may be configured as not only the bottom electrode of the capacitor 152, but also configured to provide the drain region of the transistor 116.

The capacitor dielectric material 156 of the capacitor 152 may overlay the bottom capacitor electrode 154. The capacitor dielectric material 156 may be formed of, for example and without limitation, hafnium oxide, zirconium oxide, or a high-k dielectric. As used herein, the term "high-k dielectric" refers to a material with a high dielectric constant, K, as compared to silicon dioxide. One of ordinary skill in the art will be capable of selecting other appropriate materials for use as the capacitor dielectric material 156.

The top capacitor electrode 160 may be formed from a fourth metal material 158 provided over the capacitor dielectric material 156. The fourth metal material 158 may be formed of one metal, a mixture of metals, or more than one layered metal. For example, without limitation, fourth metal material 158 may be formed of tungsten or tungsten silicide atop titanium nitride. The fourth metal material 158 may overlay the entirety or a portion of the capacitor dielectric material 156. The fourth metal material 158 may be formed in lines parallel to lines of the first metal material 118, if any.

Accordingly, a memory cell is disclosed. The memory cell comprises a transistor that comprises a source region, a drain region, and a channel region comprising an indium gallium zinc oxide material disposed between the source region and the drain region. The memory cell further comprises a capacitor in operative communication with the transistor.

A method of forming a memory cell is also disclosed. The method may be a low-temperature fabrication method. As used herein, the phrase "low-temperature fabrication method" is a method involving processing stages that utilize fabrication temperatures of less than about 800 degrees Celsius.

FIGS. 2A through 2J depict various stages of a fabrication process according to the disclosed embodiment of a method of forming a memory cell. The method may result in the fabrication of a memory cell 110 such as that discussed above and depicted in FIGS. 1A and 1B.

Figure 2A:
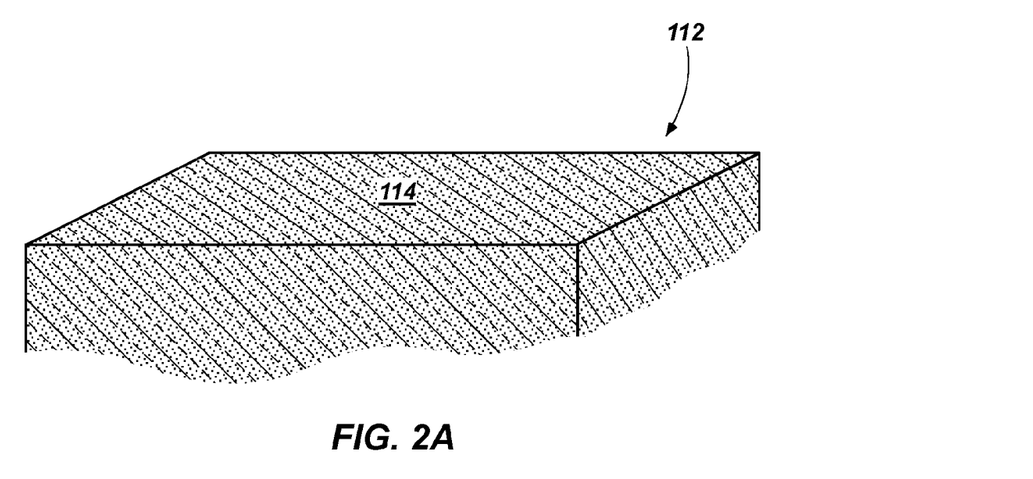
FIGS. 2A-2J are cross-sectional, top and front perspective, schematic views of a memory cell during various stages of processing according to an embodiment of the present disclosure.

With particular reference to FIG. 2A, the present method may include forming or selecting a substrate 112 having a primary surface 114. The substrate 112, or at least the primary surface 114, may be formed of a conventional semiconductor material. For example, without limitation, the substrate 112 may be formed of silicon.

Figure 2B:
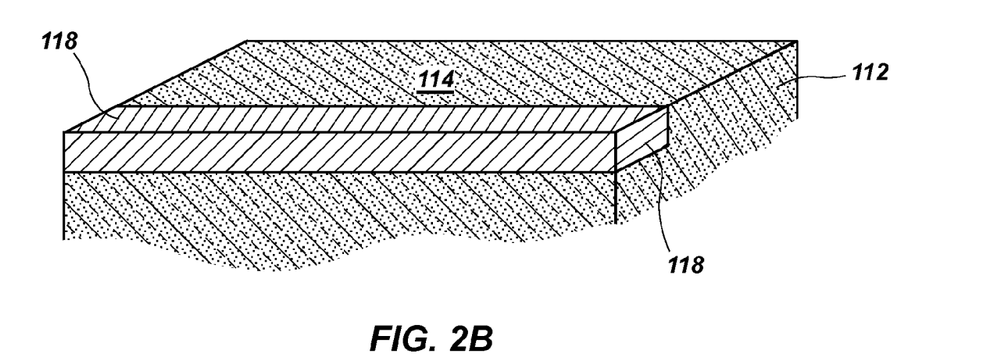

With reference to FIG. 2B, the present method includes forming a first metal material 118 supported by the substrate 112. The first metal material 118 may be formed in a continuous layer covering the primary surface 114 of the substrate 112, as shown in FIG. 1B. The first metal material 118 may alternatively be formed as an elongated line on or within the substrate 112, as shown in FIG. 2B. Elongated lines of the first metal material 118 may be conducive for inclusion in a memory cell 110 within an array of aligned memory cells 110. As such, the first metal material 118 of one memory cell 110 may extend to other memory cells 110 in a particular row or column. A plurality of aligned elongated lines of the first metal material 118 may be arranged in parallel and be separated from one another by a portion of the substrate 112 (for example, see FIGS. 3 and 4).

As illustrated in FIG. 2B, the first metal material 118 is formed as a line of metal within the substrate 112 such that a top surface of the first metal material 118 is aligned with the plane defined by the primary surface 114 of the substrate 112. One of ordinary skill in the art is capable of selecting and executing the appropriate techniques to form the first metal material 118 as depicted. This may include etching a trench into the substrate 112 and depositing the first metal material 118 within the trench. Forming the first metal material 118 may further include planarizing the top surfaces of the first metal material 118 and the primary surface 114 of the substrate 112 or planarizing just the top surface of the first metal material 118. Planarizing the first metal material 118 and substrate 112 may include abrasive planarization, chemical mechanical polishing or planarization (CMP), an etching process, or other known methods.

Figure 2C:
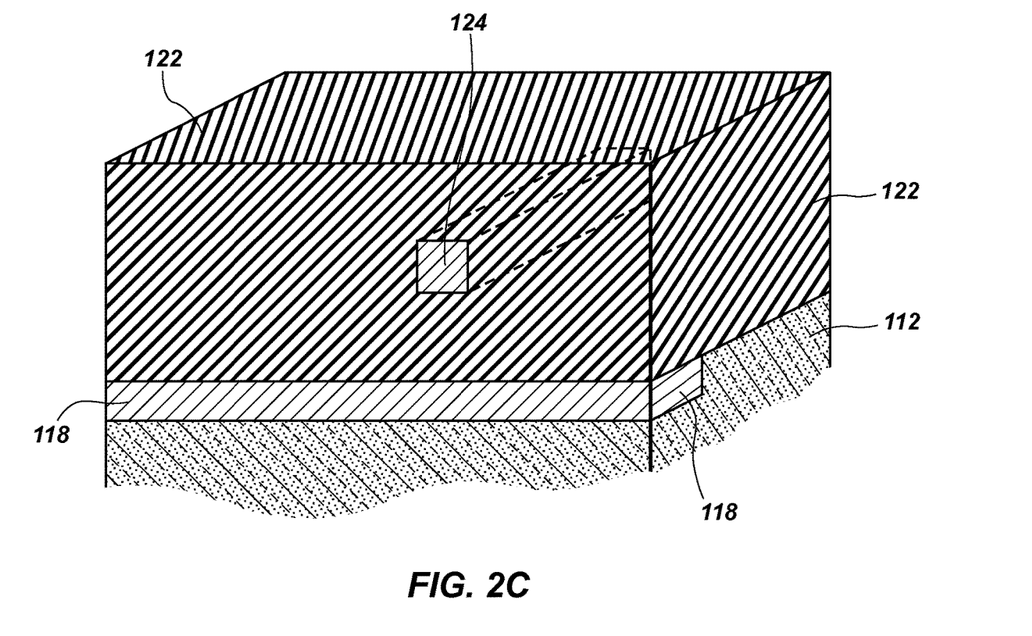

With reference to FIG. 2C, the present method further includes forming a second metal material 124 isolated from the first metal material 118. Forming the second metal material 124 isolated from the first metal material 118 may include forming the second metal material 124 such that the second metal material 124 appears to be floating within a first insulative material 122. One of ordinary skill in the art will be capable of selecting and implementing the appropriate technique or techniques to form the second metal material 124 as depicted in FIG. 2C in which the second metal material 124 is isolated from the first metal material 118 by the first insulative material 122. These techniques may include depositing a first amount of first insulative material 122, forming the second metal material 124 on or in the top surface of the first deposited amount of first insulative material 122, and applying a second amount of first insulative material 122 to cover the second metal material 124. It may further include planarizing the top surface of the second amount of first insulative material 122. Planarizing the top surface of the second amount of first insulative material 122 may be accomplished with any of the aforementioned planarizing techniques or another appropriate technique selected by one having ordinary skill in the art.

Figure 2D:
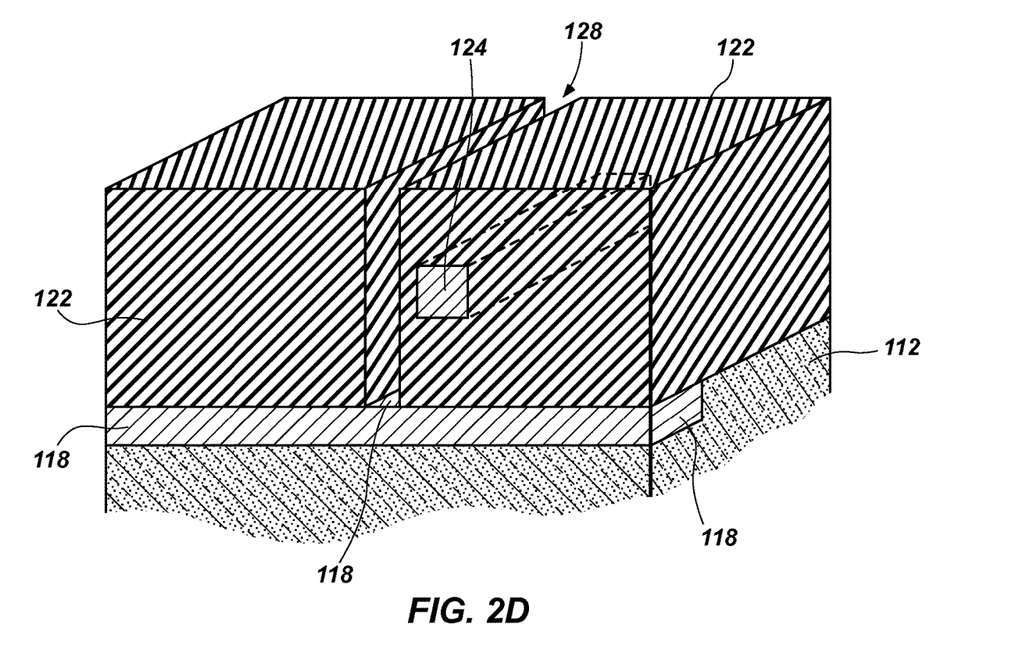
Figure 2E:
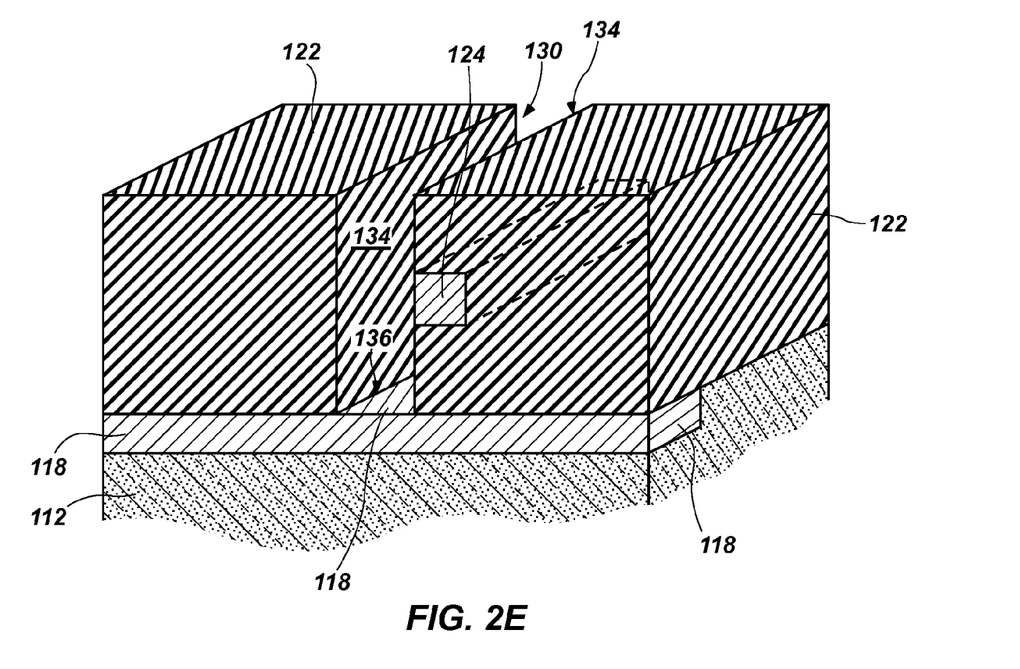

With reference to FIGS. 2D and 2E, the present method further includes forming an opening bordered at least in part by portions of the first metal material 118 and the second metal material 124. Forming such an opening may be accomplished in one or more stages. The opening may be formed by forming a first opening 128 to expose a portion of the first metal material 118, as shown in FIG. 2D, and then by forming a second opening 130 to also expose a portion of the second metal material 124, as shown in FIG. 2E. Alternatively, the opening may be formed by exposing both the first metal material 118 and the second metal material 124 in one step. One having ordinary skill in the art will be capable of selecting and implementing the appropriate technique or techniques to form the opening exposing a portion of the first metal material 118 and the second metal material 124. These techniques may include isotropically etching the first insulative material 122 to form first opening 128 to contact a portion of the first metal material 118. The techniques may further include anisotropically etching the first insulative material 122 to expand the width of the previously-formed first opening 128 until a portion of the second metal material 124 is also exposed, thus forming the second opening 130. For example, without limitation, the second opening 130 may be formed using a reactive ion etch process.

Due to the use of such techniques to form the opening bordered at least in part by the first metal material 118 and the second metal material 124, the second metal material 124 may be offset from the positioning of the first metal material 118. That is, in some embodiments, the second metal material 124 may be formed in exact alignment with the first metal material 118 such that the horizontal sides of the first metal material 118 align vertically with the horizontal sides of the second metal material 124. In such an embodiment, the second metal material 124 may completely overlap and align with the first metal material 118. In other embodiments, one of the second metal material 124 and the first metal material 118 may completely overlap the other such that vertical planes perpendicular to the primary surface 114 of the substrate 112 passing through one of the materials 124, 118 intersects with the other material 118, 124. In other embodiments, the second metal material 124 may be formed to partially overlap the first metal material 118 such that at least a portion of both the first metal material 118 and the second metal material 124 occupy space in a vertical plane perpendicular to the primary surface 114 of the substrate 112. In still other embodiments, the second metal material 124 may be completely offset from the first metal material 118 such that no vertical plane perpendicular to the primary surface 114 of the substrate 112 intersects both the first metal material 118 and the second metal material 124. Regardless of the overlapping or non-overlapping positions of the first metal material 118 and the second metal material 124, in forming the opening 130, at least a portion of the first metal material 118 is exposed and at least a portion of the second metal material 124 is exposed.

According to the depicted embodiment, the formed second opening 130 is bordered at least in part along a bottom 136 of second opening 130 by an upper portion of the first metal material 118 and is bordered at least in part along one of sidewalls 134 of the second opening 130 by a side portion of second metal material 124. In embodiments involving a single-sided gate electrode 126, the second opening 130 may be formed by forming a trench through first insulator material 122 to expose at least a portion of first metal material 118 and second metal material 124. In other embodiments, such as those in which the gate electrode 126 is a dual-sided gate, a surround gate, a ring gate, or a "U" gate, forming the second opening 130 may include removing central portions of the second metal material 124 to form the second opening 130 passing through the second metal material 124. Such second opening 130 may be bordered in part along the bottom 136 of second opening 130 by an upper portion of the first metal material 118 and bordered along multiple sidewalls 134 by side portions of the second metal material 124.

Figure 2F:
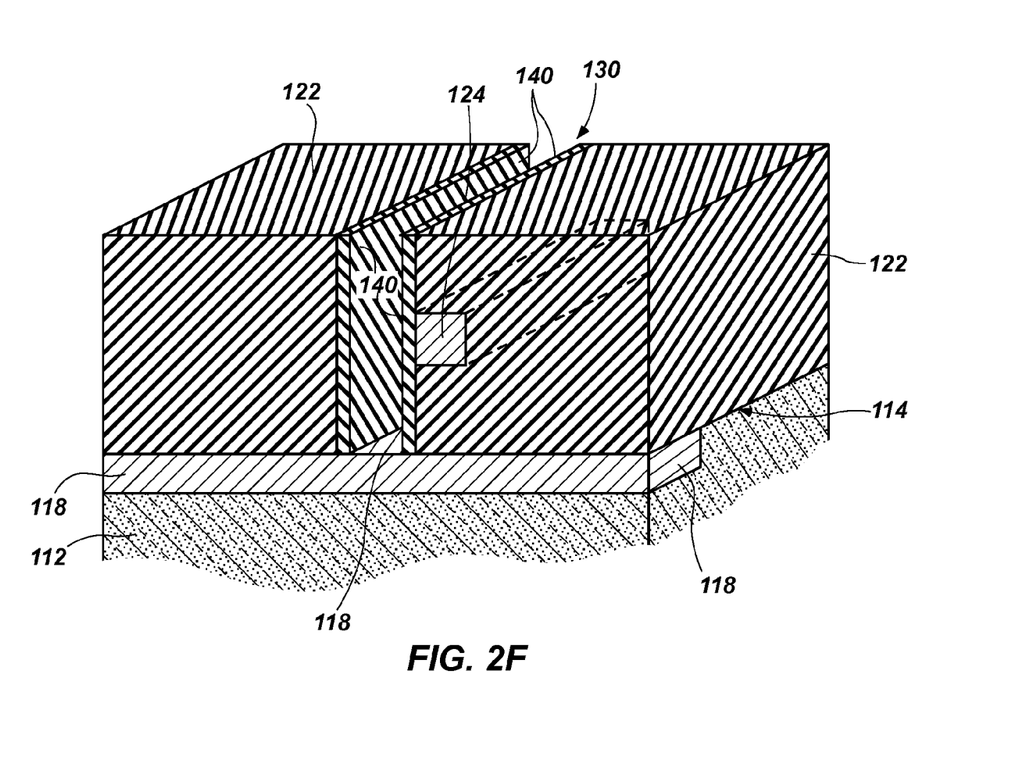

With reference to FIG. 2F, the present method includes forming a second insulative material 140 on the sidewalls 134 of the formed opening, e.g., second opening 130. The second insulative material 140 may be formed of a dielectric material, such as an oxide. The second insulative material 140 may be formed by depositing the material conformally on the sidewalls 134. For example, without limitation, the second insulative material 140 may be formed by atomic layer deposition (ALD). One of ordinary skill in the art will be capable of selecting and implementing an appropriate technique to form the second insulative material 140 on the sidewalls 134 of the second opening 130. Forming the second insulative material 140 along the sidewalls 134 of the second opening 130 may reduce the width of second opening 130, forming a slightly narrower opening 130.

Forming the second insulative material 140 may include forming the second insulative material 140 not only on the sidewalls 134 of the second opening 130, but also on the exposed surfaces of the second metal material 124 and the first metal material 118. A material-removing technique, such as a conventional spacer etching technique, may be used to remove the second insulative material 140 covering the upper surface of the first metal material 118, while leaving second metal material 124 covered by second insulative material 140.

Figure 2G:
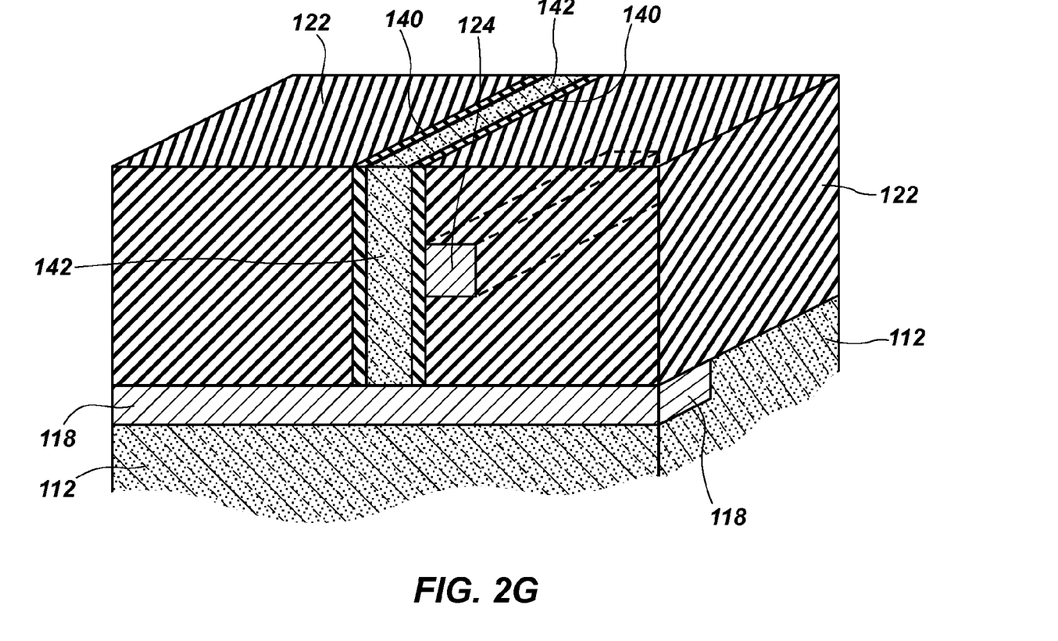

With reference to FIG. 2G, opening 130 is filled with a channel material 142 to form the channel region 144 (FIG. 1A). The channel material 142 may be IGZO. As such, filling the opening 130 with the channel material 142 may be accomplished at a temperature of less than or equal to about 800 degrees Celsius. For example, without limitation, filling the opening 130 with IGZO may be accomplished at a temperature of less than or equal to about 650 degrees Celsius. Conventional techniques for forming the other components of the memory cell 110 (e.g., the first metal material 118, the second metal material 124, and the second insulative material 140) at fabrication temperatures less than 800 degrees Celsius are known in the art. Such techniques may require, for example, fabrication temperatures less than 650 degrees Celsius, e.g., temperatures in the range of 200 to 600 degrees Celsius.

With further reference to FIG. 2G, the present method may also include planarizing the upper surface of the first insulative material 122, the second insulative material 140, and the channel material 142. Planarizing these upper surfaces may be accomplished using any planarization technique.

Figure 2H:
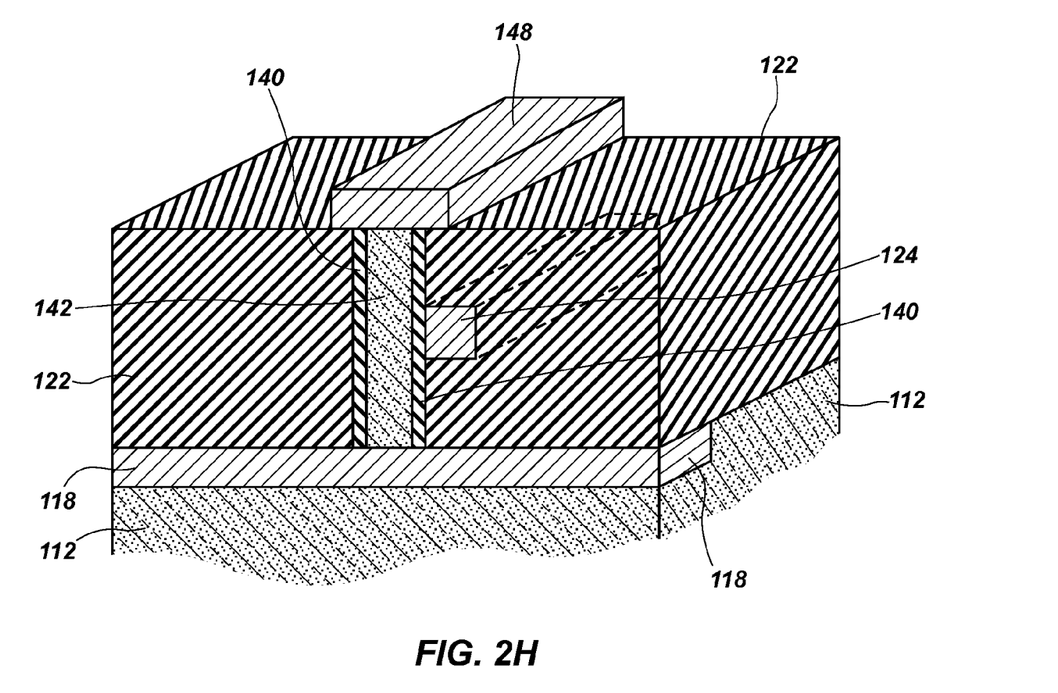

With reference to FIG. 2H, the present method further includes forming a third metal material 148 in contact with the channel material 142. The third metal material 148 may be formed atop and in contact with the channel material 142. The third metal material 148 may be formed in a continuous line so as to align with the length of the channel material 142. Alternatively, the third metal material 148 may be formed in segments, each in contact with a portion of the channel material 142. The direct contact between the metal and the channel material may form a Schottky drain region 150 (FIG. 1B). In some embodiments, the region 150 may also be doped.

Figure 2I:
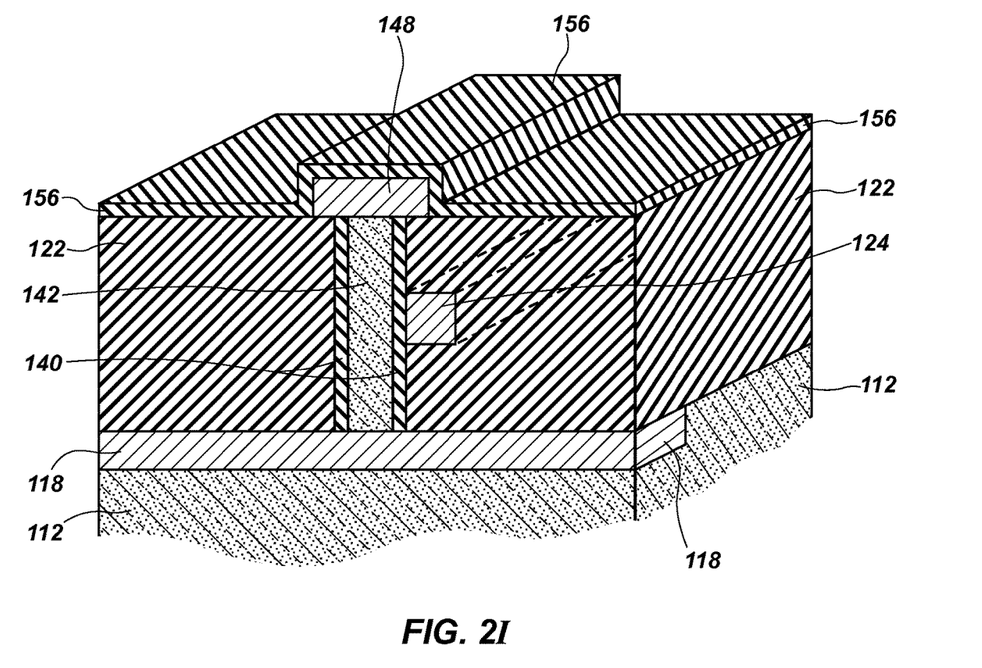

With reference to FIG. 2I, the present method further includes forming a capacitor dielectric material 156 on the third metal material 148. The capacitor dielectric material 156 may also overlay portions of the first insulative material 122 not covered by the third metal material 148. The capacitor dielectric material 156 may be configured as elongated lines or as segments and may be formed in parallel to the first metal material 118.

Figure 2J:
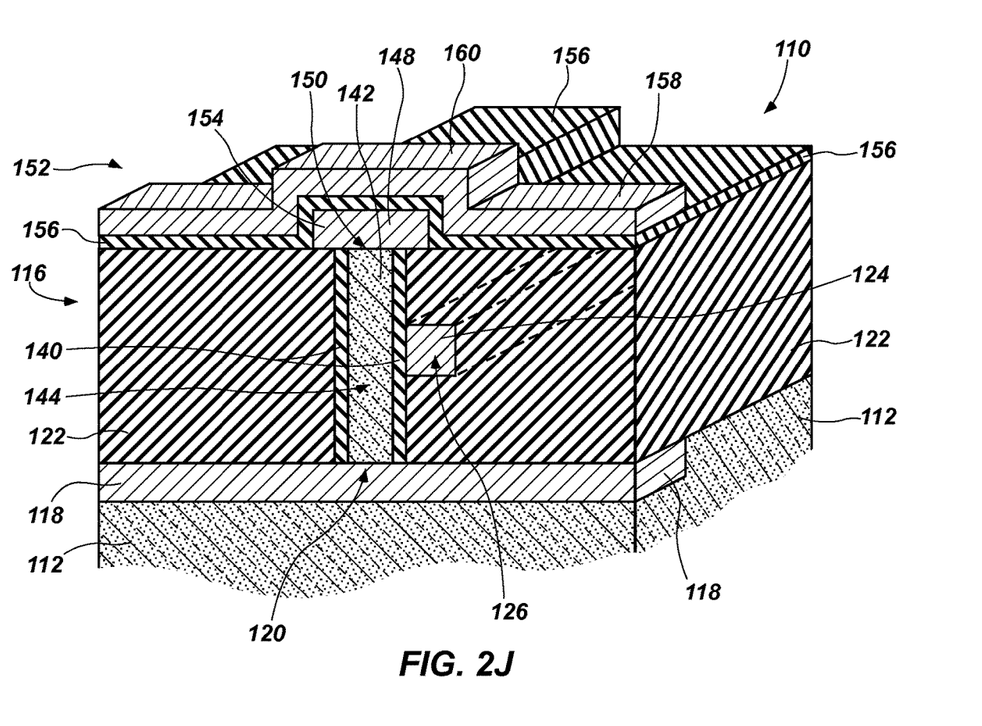

With reference to FIG. 2J, the present method further includes forming a fourth metal material 158 upon the capacitor dielectric material 156. The fourth metal material 158 may be formed along the entirety (FIG. 1B) of the capacitor dielectric material 156 and may overlay the entirety of the capacitor dielectric material 156. Alternatively, the fourth metal material 158 may be formed to overlay only a portion of the capacitor dielectric material 156, as depicted in FIG. 2J.

The memory cell 110, in other embodiments, may be structured to include a planar access transistor. In still other embodiments, the memory cell 110 may be structured to have a conventional U-shaped channel structure. Other conventional DRAM cell structures may be utilized with a channel region 144 formed of an IGZO channel material 142. Conventional techniques may be used for forming these other structures. Therefore, the details for forming these other structures are not provided herein.

Accordingly, a method of forming a memory cell is disclosed. The method comprises forming a first metal material supported by a substrate. The method also comprises forming a second metal material isolated from the first metal material. The method also comprises forming an opening bordered at least in part by the first metal material and the second metal material. The opening is defined by sidewalls of an insulative material. The method further comprises filling the opening with a channel material at a temperature less than or equal to about 800 degrees Celsius.

An array of memory cells, such as DRAM cells, is also disclosed. The array of memory cells may also be referred to herein as a "memory array." The array of DRAM cells may also be referred to herein as a "DRAM array." A DRAM array structure includes a plurality of DRAM cells, each having a channel region formed of indium gallium zinc oxide (IGZO). Each DRAM cell of the plurality is adjacent to another DRAM cell of the plurality. A DRAM cell of the plurality may be in the same horizontal plane as a neighboring DRAM cell or may be stacked upon the neighboring DRAM cell. The memory array may be structured as a cross-point array, as a cross-hair array, or as another conventional DRAM array of cells, however with channel regions formed of IGZO.

Figure 3:
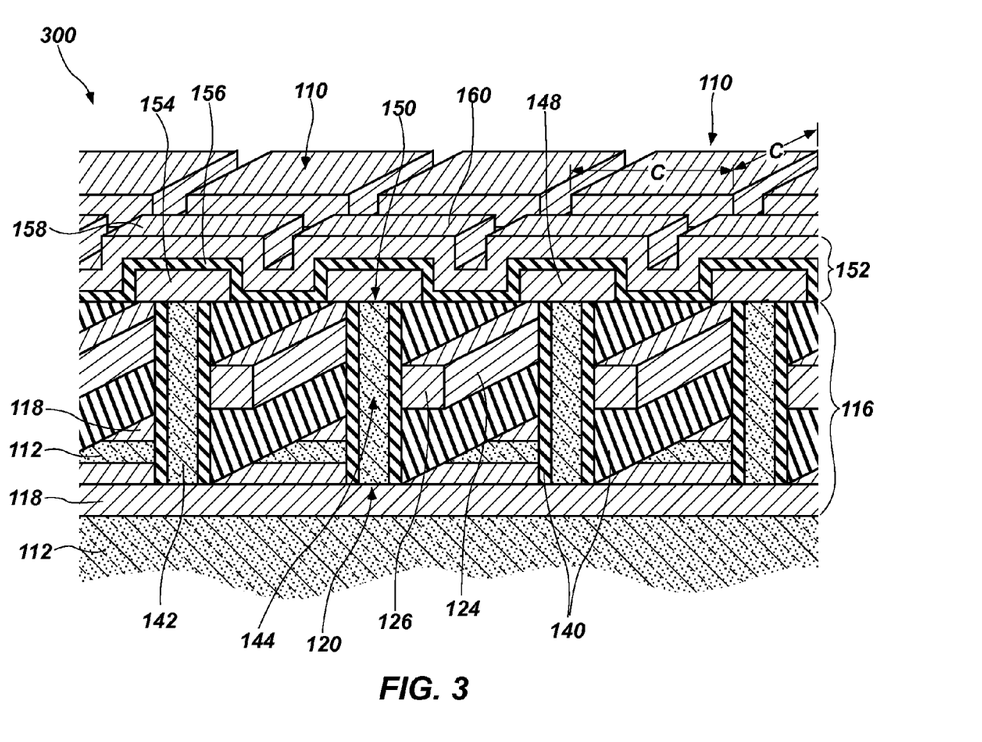
FIG. 3 is a cross-sectional, top and front perspective, schematic view of a planar array of DRAM cells of an embodiment of the present disclosure.

With reference to FIG. 3, a DRAM array 300 may be structured such that the memory cells 110 are aligned in rows and columns in the same horizontal plane. The first metal material 118 forming the source regions 120 of each transistor 116 may be arranged perpendicular to the channel material 142 forming the channel regions 144 of each transistor 116. Likewise, the third metal material 148 forming the drain region 150 of each transistor 116 may be arranged perpendicular to the channel material 142 forming the channel region 144 of each transistor 116. The second insulative material 140 and the gate electrodes 126 may be arranged in parallel to the channel material 142 and perpendicular to the first metal material 118 and the fourth metal material 158. Multiple memory cells 110 within a particular row may be in operative communication with the same gate electrode 126, second insulative material 140, and channel material 142. Therefore, for example, a gate electrode 126 in operative communication with the channel region 144 of a first memory cell 110 may also be in operative communication with the channel region 144 of a second memory cell 110 neighboring the first memory cell 110. Correspondingly, multiple memory cells 110 within a particular column may be in operative communication with the same first metal material 118 and fourth metal material 158.

Each memory cell 110 of the DRAM array 300 may be formed according to any of the above-described methods for forming a memory device. Each memory cell 110 may include a channel region 144 formed of an IGZO channel material 142.

Each memory cell 110 defines a cell area according to the dimensions of its sides. Each side may have a cell side dimension C. The cell may have equal width and length cell side dimensions C. Because the channel material 142 of each memory cell 110 may be formed of IGZO, which exhibits a relatively low sub-threshold leakage current compared to a conventional silicon channel material, the dimensions of the capacitor 152 of each memory cell 110 may be relatively small and the memory cells 110 densely packed relative to one another. Conventionally, the capacitor of a conventional memory cell is the component requiring the greatest footprint area. The size of a capacitor according to the present disclosure may be about only 10 femtofarads. A reduced capacitor 152 size therefore provides a reduced cell size of the memory cell 110. Cell side dimension C of each memory cell 110 of the present disclosure may be substantially equal to or less than 2 F, where F is known in the art as the smallest feature size capable of fabrication by conventional fabrication techniques. Therefore, the cell area of each memory cell 110 may be substantially equal to 4 $F^2$.

With reference to FIG. 4, the present disclosure further includes a semiconductor device structure 400 including multiple memory arrays 402, 404. This semiconductor device structure 400 may be a cross-point array structure. The semiconductor device structure 400 may include a stacked DRAM array. The semiconductor device structure 400 may include a plurality of planar memory arrays 402, 404, each with a structure similar to the DRAM array 300 depicted in FIG. 3. The semiconductor device structure 400 may include a first DRAM array 402 supported by the substrate 112 proximate to the primary surface 114 (FIG. 1B) of the substrate 112 and a second DRAM array 404 stacked above the first DRAM array 402. Each memory cell 110 of the first DRAM array 402 may have formed thereabove a second memory cell 110 within the second DRAM array 404. Therefore, each transistor 116 of the memory cells 110 of first DRAM array 402 may have a second transistor 116 formed thereabove. (In FIG. 4, a mid-section of second DRAM array 404 is shown cut-away for purposes of illustration.) Because the channel material 142 of each memory cell 110 of the semiconductor device structure 400 may be formed of IGZO at a temperature less than or equal to about 800 degrees Celsius, the method of forming each memory cell 110 accommodates formation of the second DRAM array 404 atop the first DRAM array 402 without heating the first DRAM array 402 to a temperature that would damage the components within the lower, first DRAM array 402.

The first DRAM array 402 and second DRAM array 404 may be isolated from one another by additional first insulative material 122 formed above the first DRAM array 402. The first metal material 118 of the second DRAM array 404 may be formed on or otherwise supported by the first insulative material 122 formed above the first DRAM array 402. The memory cells 110 of the first DRAM array 402 may be arranged perpendicularly to the memory cells 110 of the second DRAM array 404. Therefore, channel region 144 of a memory cell 110 within the first DRAM array 402 may be arranged perpendicularly to channel region 144 of a memory cell 110 within the second DRAM array 404. Each memory cell 110 of the semiconductor device structure 400 may be formed according to any of the above-described methods for forming a memory cell. Each memory cell 110 may include a channel region 144 formed of IGZO.

Figure 5:
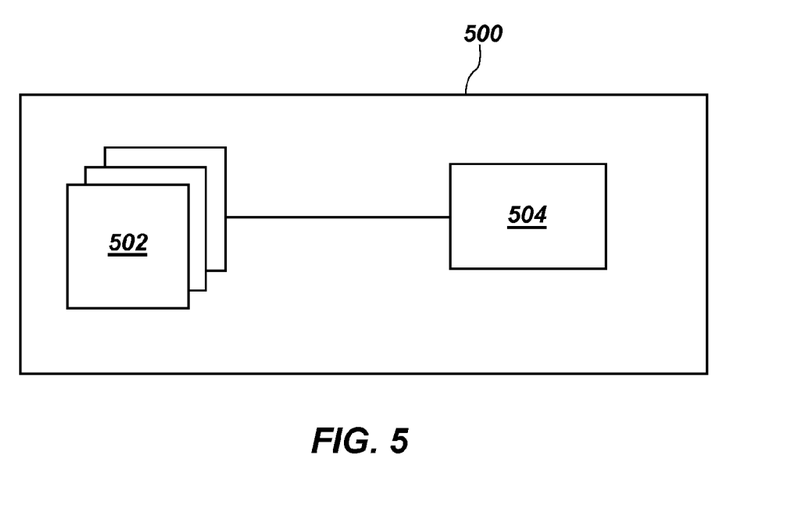
FIG. 5 is a simplified block diagram of a semiconductor device including a memory array of one or more embodiments described herein.

With reference to FIG. 5, illustrated is a simplified block diagram of a semiconductor device 500 implemented according to one or more embodiments described herein. The semiconductor device 500 includes a memory array 502 and a control logic component 504. The memory array 502 may be any of the depicted DRAM arrays 300 (FIG. 3), 402 (FIG. 4), 404 (FIG. 4). The control logic component 504 may be configured to operatively interact with the memory array 502 so as to read, write, or re-fresh any or all memory cells (e.g., memory cell 110 (FIG. 1A)) within the memory array 502.

Accordingly, a semiconductor device comprising a dynamic random access memory (DRAM) array is disclosed. The DRAM array comprises a plurality of DRAM cells. Each DRAM cell of the plurality comprises a channel region comprising indium gallium zinc oxide.

A method of forming a memory array comprising forming a plurality of memory cells is also disclosed. Forming a plurality of memory cells comprises forming at least one memory cell of the plurality. Forming at least one memory cell of the plurality comprises forming a first transistor. Forming a first transistor comprises forming a source region supported by a substrate and forming a gate electrode isolated within an insulative material above the source region. Forming a first transistor further comprises forming an opening in the insulative material to expose at least a portion of each of the source region and the gate electrode. Forming the first transistor further comprises filling the opening with a channel material at a temperature less than or equal to about 800 degrees Celsius. The method of forming at least one memory cell of the plurality further comprises forming a capacitor in electrical connection with the channel material. The method of forming a plurality of memory cells further comprises forming another memory cell of the plurality. Forming another memory cell of the plurality comprises forming a second transistor above the capacitor and forming a second capacitor above the second transistor.

A method of utilizing a memory cell, such as a DRAM cell, having a channel region formed of indium gallium zinc oxide is also disclosed. The method includes refreshing the DRAM cell no more frequently than once every one hour. Refreshing the cell may include reading and recharging each memory cell 110 to restore the capacitor 152 to a charge corresponding to the appropriate binary value, i.e., 0 or 1. The method of utilizing the memory cell 110 may include refreshing the cell 110 no more frequently than every 10 hours. For example, without limitation, the method may include refreshing the cell 110 no more frequently than every 24 hours.

Figure 6:
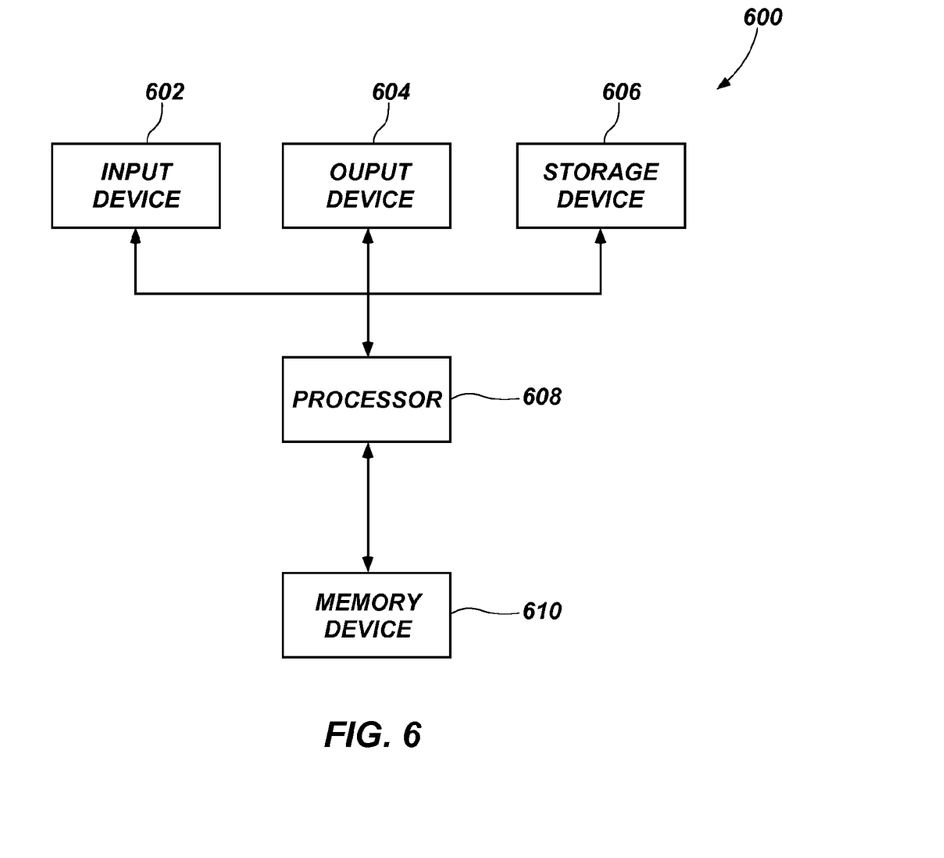
FIG. 6 is a simplified block diagram of a system implemented according to one or more embodiments described herein.

With reference to FIG. 6, illustrated is a simplified block diagram of a system 600 implemented according to one or more embodiments described herein. The system 600 includes at least one input device 602. The input device 602 may be a keyboard, a mouse, or a touch screen. The system 600 further includes at least one output device 604. The output device 604 may be a monitor, touch screen, or speaker. The input device 602 and the output device 604 are not necessarily separable from one another. The system 600 further includes a storage device 606. The input device 602, output device 604, and storage device 606 are coupled to a conventional processor 608. The system 600 further includes a memory device 610 coupled to the processor 608. The memory device 610 includes at least one memory cell, such as a memory cell 110 (FIG. 1A), according to one or more embodiments described herein. The memory device 610 may include an array of memory cells, such as DRAM array 300 (FIG. 3), arrays 402, 404 (FIG. 4), or semiconductor device structure 400 (FIG. 4). The system 600 may be incorporated within a computing, processing, industrial, or consumer product. For example, without limitation, the system 600 may be included within a personal computer, a handheld device, a camera, a phone, a wireless device, a display, a chip set, a game, a vehicle, or other known systems.

Accordingly, also disclosed is a system comprising a memory array comprising a plurality of dynamic random access memory (DRAM) cells. Each DRAM cell of the plurality comprises a channel region comprising an indium gallium zinc oxide material.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A semiconductor device comprising:
a dynamic random access memory (DRAM) array comprising:
DRAM cells, each DRAM cell comprising a channel region comprising indium gallium zinc oxide, opposing ends of the channel region in direct contact with a metal material, a first DRAM cell of the DRAM cells supported by a material, a second DRAM cell of the DRAM cells positioned above the first DRAM cell of the DRAM cells, and a first channel material of the first DRAM cell perpendicular to a second channel material of the second DRAM cell.

2. A semiconductor device comprising:
a dynamic random access memory (DRAM) array comprising:
DRAM cells, each DRAM cell comprising a channel region comprising indium gallium zinc oxide, opposing ends of the channel region in direct contact with a metal material, and at least one DRAM cell of the DRAM cells comprising:
a transistor comprising the channel region comprising indium gallium zinc oxide; and
a capacitor comprising:
a bottom capacitor electrode configured to provide a drain region of the transistor.

3. The semiconductor device of claim 2, wherein the channel region of each DRAM cell is oriented vertically relative to a surface of a material supporting the semiconductor device.

4. The semiconductor device of claim 2, wherein the transistor is oriented vertically relative to a surface of a material on which the transistor is located.

5. The semiconductor device of claim 2, further comprising an insulative material directly contacting sidewalls of the channel region.

6. The semiconductor device of claim 2, further comprising another insulative material surrounding the channel region.

7. The semiconductor device of claim 5, wherein an upper surface of the channel region is substantially coplanar with an upper surface of the insulative material.

8. The semiconductor device of claim 2, wherein the capacitor further comprises a top capacitor electrode and a capacitor dielectric material between the bottom capacitor electrode and the top capacitor electrode.

9. The semiconductor device of claim 2, wherein a first channel region of a first DRAM cell is parallel to a second channel region of a second DRAM cell.

10. The semiconductor device of claim 9, further comprising a gate electrode in operative communication with the first channel region and the second channel region.

11. The semiconductor device of claim 9, further comprising an additional metal material in contact with the first channel region and the second channel region.

12. A method of forming a semiconductor device comprising:
forming a dynamic random access memory (DRAM) array comprising DRAM cells, forming the DRAM cells comprising at least a first DRAM cell and at least a second DRAM cell, comprising:
forming a first transistor of the first DRAM cell comprising:
forming a source region supported by a material;
forming a gate electrode isolated within an insulative material above the source region;
forming an opening in the insulative material to expose at least a portion of each of the source region and the gate electrode; and
forming a first channel material comprising indium gallium zinc oxide in the opening at a temperature less than or equal to about 800 degrees Celsius to form a first channel region comprising indium gallium zinc oxide, opposing ends of the channel region in direct contact with a metal material; and
forming a first capacitor of the first DRAM cell in electrical connection with the channel material; and
forming the second DRAM cell positioned above the first DRAM cell comprising:
forming a second transistor of the second DRAM cell above the first capacitor, the second transistor comprising a second channel material perpendicular to the first channel material; and
forming a second capacitor of the second DRAM cell above the second transistor.

13. The method of claim 12, wherein forming a first capacitor of the first DRAM cell comprises:
forming a bottom capacitor electrode over the first channel material;
forming a capacitor dielectric material over the bottom capacitor electrode; and
forming a top capacitor electrode over the capacitor dielectric material;
wherein the bottom capacitor electrode is integrated with a drain region of the first transistor.

14. A semiconductor device comprising:
a dynamic random access memory (DRAM) array comprising DRAM cells, each DRAM cell comprising:
a transistor comprising an indium gallium zinc oxide channel region isolated from a gate electrode by an insulative material; and
a capacitor in operative communication with the transistor, the capacitor comprising a bottom capacitor electrode, a top capacitor electrode, and a capacitor dielectric material between the bottom capacitor electrode and the top capacitor electrode and the bottom capacitor electrode of the capacitor configured to provide a drain region of the transistor.

15. The semiconductor device of claim 14, wherein the bottom capacitor electrode of the capacitor is aligned with a length of the indium gallium zinc oxide channel region.

16. The semiconductor device of claim 14, wherein the bottom capacitor electrode of the capacitor comprises segments in contact with a portion of the indium gallium zinc oxide channel region.

17. The semiconductor device of claim 14, wherein a first DRAM cell of the DRAM cells occupies a horizontal plane also occupied by a second DRAM cell of the DRAM cells.

18. The semiconductor device of claim 14, wherein the gate electrode comprises a single gate electrode.

19. The semiconductor device of claim 14, wherein the gate electrode comprises an access line.

* * * * *